United States Patent [19]

Tanida

[11] Patent Number: 5,345,373
[45] Date of Patent: Sep. 6, 1994

[54] LENS HOLDING BLOCK ENABLING ACCURATE LENS POSITIONING

[75] Inventor: Kazuhiro Tanida, Kanagawa, Japan

[73] Assignee: Sumitomo Electric Industries, Ltd., Osaka, Japan

[21] Appl. No.: 61,006

[22] Filed: May 14, 1993

[30] Foreign Application Priority Data

May 18, 1992 [JP] Japan .................. 4-124513

[51] Int. Cl.$^5$ .............................. F21V 7/00
[52] U.S. Cl. .................... 362/455; 372/101
[58] Field of Search ............... 372/101; 362/259, 268, 362/455, 800

[56] References Cited

FOREIGN PATENT DOCUMENTS

| | | |
|---|---|---|
| 0259888 | 3/1988 | European Pat. Off. |
| 0356331 | 2/1990 | European Pat. Off. |
| 0373225 | 6/1990 | European Pat. Off. |
| 0481877 | 4/1992 | European Pat. Off. |
| 193710 | 4/1989 | Japan |
| 3120884 | 5/1991 | Japan |
| 4213413 | 8/1992 | Japan |

OTHER PUBLICATIONS

Patent Abstracts of Japan, vol. 15, No. 95 (P-1176) Mar. 1991 & JP-A-23 08 209 (Hitachi) 21 Dec. 1990 *abstract*.
Patent Abstracts of Japan, vol. 15, No. 196 (P-120) 21 May 1991 & JP-A-30 48 209 (Hitachi) 1 Mar. 1991 *abstract*.
Patent Abstracts of Japan, vol. 13, No. 438 (P-939) 3 Oct. 1989 & JP-A-11 67 706 (Oki Electric) 3 Jul. 1989 *abstract*.
Patent Abstracts of Japan, vol. 14, No. 448 (P-1141) 12 Dec. 1990 & JP-A-22 38 410 (Oki Electric) 20 Sep. 1990 *abstract*.
Database WPI, Week 8949, Derwent Publications, Ltd., London, GB; AN 89-361216 & JP-A-1 271 713 (Hitachi) 30 Oct. 1989 *abstract*.

*Primary Examiner*—Stephen F. Husar
*Attorney, Agent, or Firm*—Cushman, Darby & Cushman

[57] ABSTRACT

A flat portion has a flat top surface, on which a chip carrier is provided. A light-emitting element is mounted on the chip carrier. A vertical portion is integral with the flat portion and extends vertically, i.e., perpendicularly to the flat top surface of the flat portion. A metal plate made of a metal having good welding performance is silver-brazed onto the vertical portion. A lens barrel containing a lens for focusing a light beam from the light-emitting element is inserted in a through-hole of the vertical portion and the metal plate, and welded to the metal plate so that the optical axes of the light-emitting element and the lens coincide with each other.

12 Claims, 3 Drawing Sheets

LENS HOLDING BLOCK ENABLING ACCURATE LENS POSITIONING

BACKGROUND OF THE INVENTION

The present invention relates to a lens holding block to be used in light-emitting modules for the optical communication etc.

In the optical communication technology, an electro-optical conversion element such as a laser diode or LED is used as a signal source or light-emitting source. The positioning in an optical system needs to be performed with micron-order accuracy to efficiently introduce light from the above light-emitting element to an optical fiber.

Referring to FIGS. 5 and 6, a description is made of coupling between a lens and a light-emitting element mounted on a chip carrier.

As shown in FIG. 5, a light-emitting element 13 is mounted on a recess 12 of a chip carrier 14, which is provided on the top surface of a block 11. Also provided on the top surface of the block 11 is a metal lens-barrel 16 containing a lens 15 for focusing light emitted from the light-emitting element 13. The positioning between the light-emitting element 13 and the lens 15 is performed such that the lens-barrel 16 is first positioned with respect to the light-emitting element 13 and then fixed using wedge-shaped parts 17. However, the insertion of the wedge-shaped parts 17 may break the once optimized positional relationship between the light-emitting element 13 and the lens 15. Therefore, this type of positioning is deficient in accuracy.

In the case of FIG. 6, instead of using the wedge-shaped parts 17, a lens-barrel 16 containing a lens 15 is pressed against and fixed to the end face of a block 11 on which a chip carrier 14 having a light-emitting element 13 is mounted. While this type of positioning can provide sufficient accuracy within a plane perpendicular to the optical axis, it is also deficient in accuracy in the optical-axis direction because the distance between the lens 15 and the light-emitting element 13 is adjusted visually using a microscope or is dependent on the accuracy of machining.

SUMMARY OF THE INVENTION

An object of the present invention is to provide a lens holding block which enables accurate positioning between a light-emitting element and a lens.

According to the invention, a lens holding block for holding a chip carrier on which a light-emitting element is mounted and a lens-barrel containing a lens for focusing a light beam emitted from the light-emitting element, comprises:

a flat portion having a flat top surface on which the chip carrier is to be provided; and a vertical portion being perpendicular to the flat top surface and integral with the flat portion and having an opening into which the lens-barrel is to be inserted, for holding the lens-barrel so that optical axes of the light-emitting element and the lens coincide with each other.

DESCRIPTION OF THE PREFERRED EMBODIMENTS

Lens holding blocks according to preferred embodiments of the present invention are hereinafter described with reference to the accompanying drawings.

Embodiment 1

Figure 1:
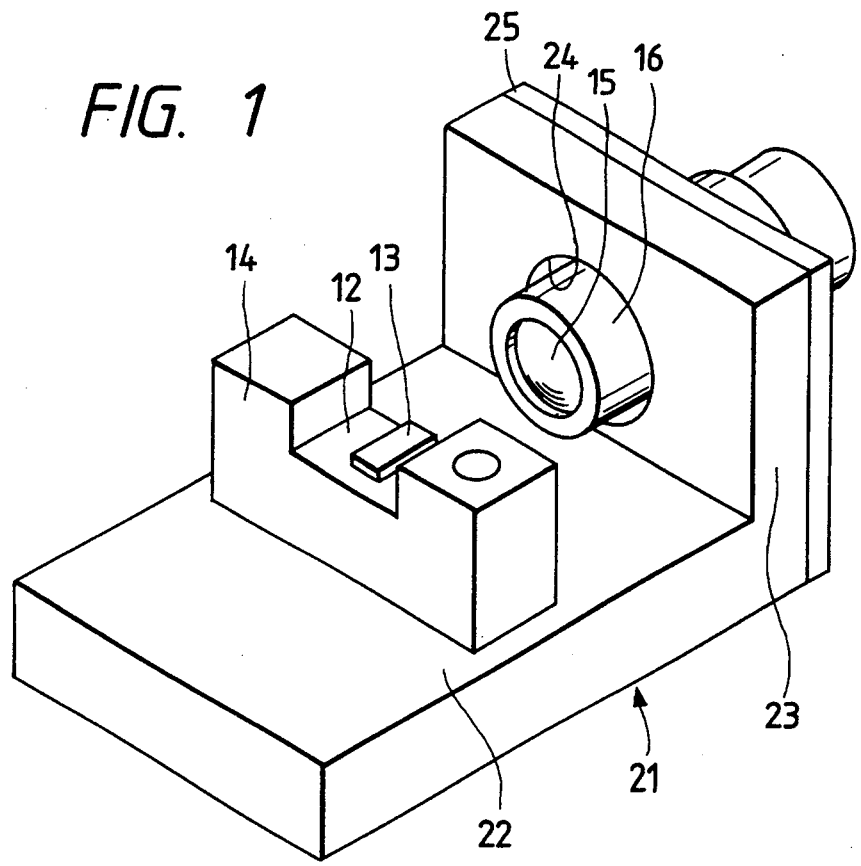
FIG. 1 is a perspective view of a lens holding block according to a first embodiment of the present invention.
Figure 2:
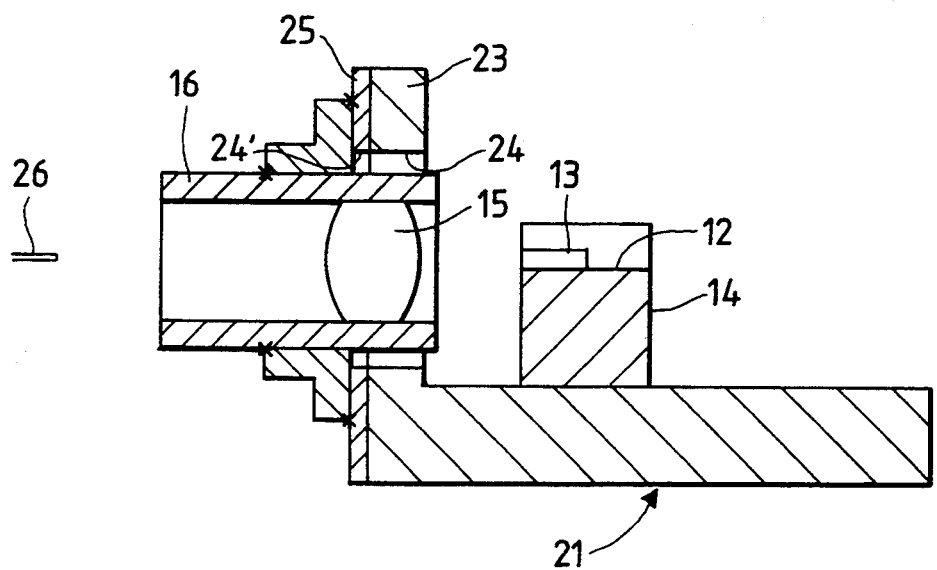
FIG. 2 is a sectional view of the lens holding block of FIG. 1.

FIGS. 1 and 2 are a perspective view and a sectional view of a lens holding block according to a first embodiment of the invention.

In this lens holding block, a block flat portion 22 of a block main body 21 has a flat surface, on which a chip carrier 14 is provided. A light-emitting element 13 is mounted on a recess 12 of the chip carrier 14. The block main body 21 further has a block vertical portion 23 extending upward, i.e., perpendicularly to the flat surface of the block flat portion 22. The block flat portion 22 and the block vertical portion 23 are integral with each other.

A through-hole 24 is formed in the block vertical portion 23, and serves to fixedly hold a lens-barrel 16 (containing a lens 15) so that its axis coincides with the optical axis of the light-emitting element 13. That is, the diameter of the through-hole 24 is larger than the outer diameter of the lens-barrel 16 so that the central axis of the lens 15 can be made coincident with the optical axis of the light-emitting element 13 and that the distance therebetween can be adjusted.

It is preferred that the block main body 21 be made of a metal having a large heat conductivity to efficiently conduct the heat generated by the light-emitting element 13.

Further, to enable welding with high fixing accuracy, a metal plate 25 having good welding performance (e.g., a Fe-Ni-Cr alloy and a Fe-Ni alloy) is silver-brazed onto the block vertical portion 23 on its side opposite to the side where the chip carrier 14 is provided. A though hole 24' for holding the lens-barrel 16 is also formed in the metal plate 25 in the same manner as the through-hole 24 in the block vertical portion 23.

With the above constitution, the relative positioning between the lens 15 and the light-emitting element 13 is performed in the following manner. First, the block main body 21 is fixed in, for instance, a transmission module. Then, while output light of an optical fiber 26 (that is located on the side of the lens-barrel 16 opposite to the side where the light-emitting element 13 is provided) is monitored, the lens-barrel 16 (containing the lens 15) is moved along and rotated about the optical axis and two axes perpendicular to the optical axis. The relative positioning is performed with accuracy of about 0.1 $\mu$m.

As a result, highly accurate positioning can be performed without relying on the machining accuracy or visual recognition using a microscope or the like.

As for the fixing by welding, since the welding portion (indicated by marks "x" in FIG. 2) for fixing the lens barrel 16 is located on a circle having the optical axis as its center, the welding (e.g., YAG laser welding) can be performed simultaneously at a plurality of points.

Therefore, a deviation between the axes can be minimized, in contrast to the case of using the wedge-shaped parts.

Embodiment 2

Figure 3:
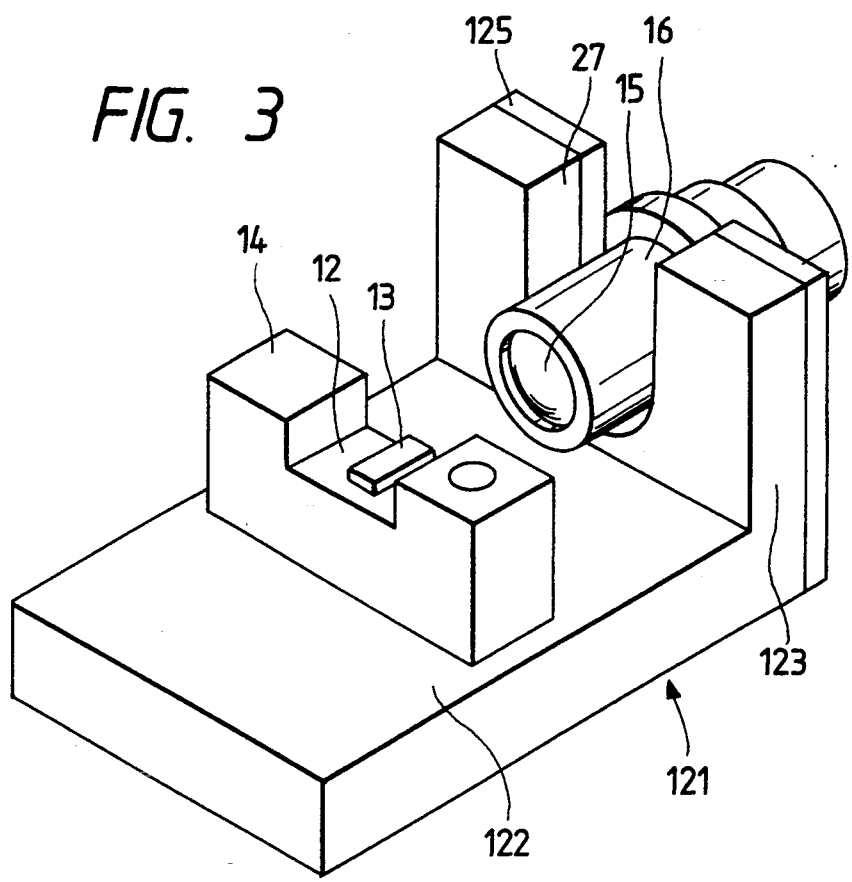
FIG. 3 is a perspective view of a lens holding block according to a second embodiment of the invention.

FIG. 3 shows a lens holding block according to a second embodiment of the invention.

Like the block main body 21 of the first embodiment (FIG. 1), a block main body 121 of this embodiment has a block flat portion 122 and a block vertical portion 123, which are perpendicular to and integral with each other. A metal plate 125 is silver-brazed onto the block vertical portion 123. As a specific feature of this embodiment, the block vertical portion 123 and the metal plate 125 has respective cut portions 27 and 27' for holding the lens barrel 16.

According to this embodiment, since the approximate position of the lens barrel 16 containing the lens 15 can be recognized with a microscope, the time required for the lens positioning can be reduced.

Embodiment 3

Figure 4:
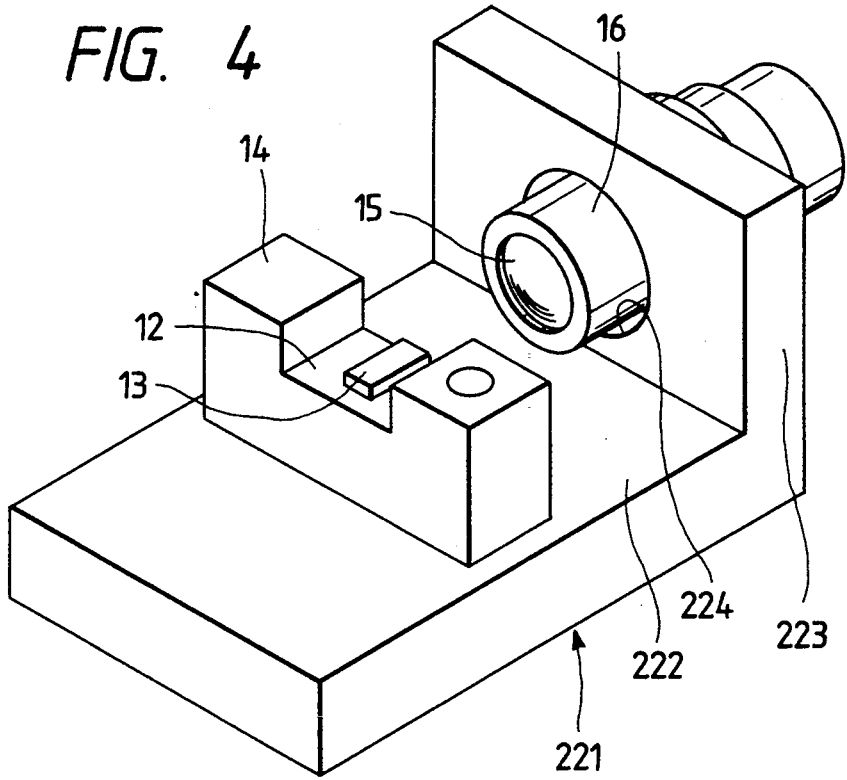
FIG. 4 is a perspective view of a lens holding block according to a third embodiment of the invention.
Figure 5:
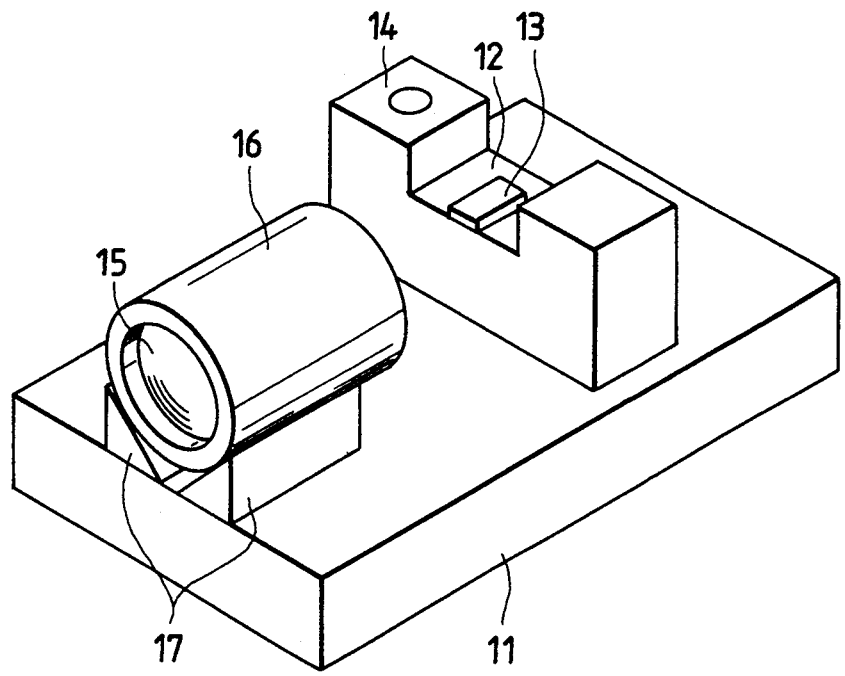
FIG. 5 is a perspective view of a conventional lens holding block.
Figure 6:
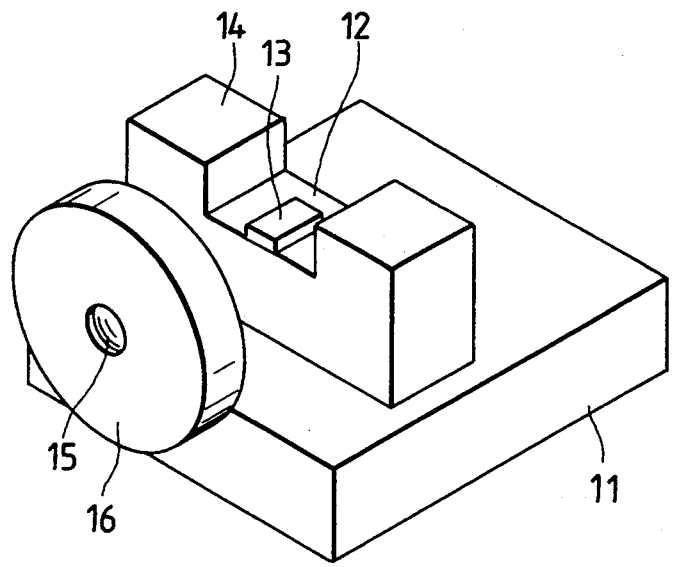
FIG. 6 is a perspective view of another conventional lens holding block.

FIG. 4 shows a lens holding block according to a third embodiment of the invention.

A block main body 221 of this embodiment consisting of a block flat portion 222 and a block vertical portion 223 has the same structure as the block main body 21 of the first embodiment (FIG. 1). As a specific feature of this embodiment, the block main body 221 is made of a Fe-Ni-Cr alloy. Therefore, the metal plate 25 for YAG laser welding of the FIG. 1 lens holding block is not required in this embodiment.

The lend holding block of this embodiment may be suitable for the case where quantity of the heat generated by the light-emitting element 13 is small or the temperature of the light-emitting element 13 need not be controlled with high accuracy.

As described above, according to the invention, the relative positioning between the lens and the light-emitting element can be performed with high accuracy, and the lens holding block of the invention can be effectively used in transmission modules for the optical communication etc.

What is claimed is:

1. A lens holding block on which a light-emitting element and a lens-barrel containing a lens for focusing a light beam emitted from the light-emitting element are to be mounted, comprising:
    a flat portion having a flat top surface on which the light-emitting element is to be mounted;
    a vertical portion being perpendicular to the flat top surface and integral with the flat portion and having the opening into which the lens-barrel is to be inserted, for holding the lens-barrel so that optical axes of the light-emitting element and the lens coincide with each other; and
    a metal plate made of a metal having good welding performance, having an opening, and fixed to the vertical portion on a side opposite to a side where the light-emitting element is to be provided so that the openings of the metal plate and the vertical portion conform to each other.

2. The lens holding block of claim 1, wherein the metal plate is silver-brazed onto the vertical portion.

3. The lens holding block of claim 1, wherein the openings of the vertical portion and the metal plate constitute a through-hole.

4. The lens holding block of claim 1, wherein the opening of the vertical portion and the metal plate have a cut portion.

5. The lens holding block of claim 1, wherein the metal plate is made of a Fe-Ni-Cr alloy.

6. The lens holding block of claim 1, wherein a chip carrier on which the light-emitting element is to be mounted is further provided on the flat top surface.

7. A light source unit comprising:
    a light-emitting element;
    a chip carrier on which the light-emitting element is mounted;
    a lens for focusing a light beam emitted from the light-emitting element;
    a lens-barrel containing the lens;
    a lens holding block comprising:
        a flat portion having a flat top surface on which the chip carrier is provided;
        a vertical portion being perpendicular to the flat top surface and integral with the flat portion and having an opening in which the lens-barrel is inserted, and holding the lens-barrel so that optical axes of the light-emitting element and the lens coincide with each other; and
    a metal plate made of a metal having good welding performance, having an opening, and fixed to the vertical portion on a side opposite to a side where the light-emitting element is to be provided so that the openings of the metal plate and the vertical portion conform to each other.

8. The light source unit of claim 7 wherein the metal plate is silver-brazed onto the vertical portion.

9. The light source unit of claim 7, wherein the openings of the vertical portion and the metal plate constitute a through-hole.

10. The light source unit of claim 7, wherein the opening of the vertical portion and the metal plate have a cut portion.

11. The light source unit of claim 7, wherein the metal plate is made of a Fe-Ni-Cr alloy.

12. The light source unit of claim 7, wherein the lens-barrel is welded to the metal plate.

* * * * *